United States Patent [19]

Dougherty

[11] 4,046,193

[45] Sept. 6, 1977

[54] CLOSED ELECTRICAL APPARATUS CABINET EMBODYING A VAPORIZATION CHAMBER AND CABINET TOP THEREOF

[75] Inventor: Michael L. Dougherty, Sanford, Fla.

[73] Assignee: Westinghouse Electric Corporation, Pittsburgh, Pa.

[21] Appl. No.: 658,948

[22] Filed: Feb. 18, 1976

[51] Int. Cl.² .................. F28D 15/00; H01L 23/42
[52] U.S. Cl. .................. 165/105; 336/58; 357/82; 361/389
[58] Field of Search .............. 165/105; 317/100; 336/55, 57, 58; 357/82

[56] References Cited

U.S. PATENT DOCUMENTS

| 2,341,548 | 2/1944 | Heineman | 165/105 X |
| 3,018,087 | 1/1962 | Steele | 165/105 |
| 3,154,139 | 10/1964 | Hager, Jr. | 165/105 |
| 3,390,541 | 7/1968 | Johnson et al. | 165/105 X |

Primary Examiner—Albert W. Davis, Jr.
Attorney, Agent, or Firm—C. M. Lorin

[57] ABSTRACT

A cabinet for electrical equipment to be protected from an hostile environment comprising a sealed top section consisting of a vaporization chamber containing trichlorotrifuoroethane, or other suitable working fluid, with the upper surface having a generally recessed polyhedral shape to promote return of condensate at the roof of the vaporization chamber to replenish the liquid in the chamber.

6 Claims, 2 Drawing Figures

CLOSED ELECTRICAL APPARATUS CABINET EMBODYING A VAPORIZATION CHAMBER AND CABINET TOP THEREOF

BACKGROUND OF THE INVENTION

This invention relates to an enclosure for electrical apparatus providing, in an overall light and rigid structure, total isolation of the electrical apparatus from ambient conditions while preserving excellent heat transfer proficiency.

When electrical apparatus must be placed inside an enclosure, it is necessary to prevent temperature build-up due to heat accumulation in, or around, the electrical parts. Usually external air is blown inside and through the enclosure in order to evacuate the accumulated heat. However, it is not desirable to do so when the equipment is operated in a dirty, hostile atmosphere, since particles introduced into the enclosure could cause electrical failure.

It is known to cool electrical equipment with air-to-air liquid-to-air heat exchangers in direct contact with the critical electrical parts (for instance electrodes) or rather with a heat sink, in order to remove the heat toward a heat dissipator.

It is also known to remove localized hot spots of an electrical apparatus with a heat pipe, e.g. a sealed off device containing a liquid which is vaporized on a side exposed to the heat sink, and condensed on the side exposed to the heat dissipator. Vaporization chambers are known which contain a fluid which takes up heat by vaporization against a hot wall, the vapor being spread onto a cool wall where it is being condensed and returned by gravity for reuse along the hot wall thereof. The essential distinctions between a heat pipe and a vaporization chamber are:

a. A heat pipe is used for localized heat transfer. It returns the condensate to the reservoir via capillary action in a wick, thus, it can operate under conditions of zero gravity. Physically, they are tubular in shape with a large length to diameter ratio.

b. A vapor chamber uses only gravity to return condensate to the reservoir. Its function is to transfer heat in a gross or macro sense of an apparatus rather than a localized hot spot.

SUMMARY OF THE INVENTION

The present invention resides in using a vaporization chamber as the top section of an enclosure housing totally enclosed electrical apparatus, so that the heat generated by the electrical apparatus is absorbed by the lower surface of the vaporization chamber, while the condensate of the vaporized fluid is being returned by gravity from the top surface of the vaporization chamber used as a heat dissipator to the ambient.

The invention distinguishes over vaporization chamber, or heat pipes, of the prior art in that the cooling structure itself is part of the overall housing structure of the electrical apparatus, rather than being merely a cooling device embodied within a predetermined vessel structure. The invention also provides for a working fluid within the vaporization chamber having a temperature of vaporization at one atmosphere pressure which is under the critical temperature of the enclosed electric apparatus so that the vapor build-up within the vaporization chamber substantially remains at the ambient atmospheric pressure. As a result, no particular reinforcing structure is needed, in general, for the vaporization chamber.

The invention, further provides that the metallic wall defining the surfaces of the vaporization chamber, in particular the heat evaporator and the heat dissipator of the vaporization chamber, are given a minimum thickness, with the additional feature that areas of the heat dissipator are inclined at an angle to the overall horizontal plane of the top surface which create internal protrusions in the vaporization chamber which promote condensate return by gravity from the heat dissipator, or condenser, to the surface of the working fluid, while at the same time providing structural reinforcement compensating for the minimum thickness chosen. As a result, maximum heat dissipation at the top surface and maximum condensate return circulation are obtained in conjunction with improving the housing structure integrity.

The invention will be more fully understood from a consideration of the preferred embodiment described hereinafter as an illustration of how the invention can best be readily carried into practice.

THE PREFERRED EMBODIMENT OF THE INVENTION

Figure 1:
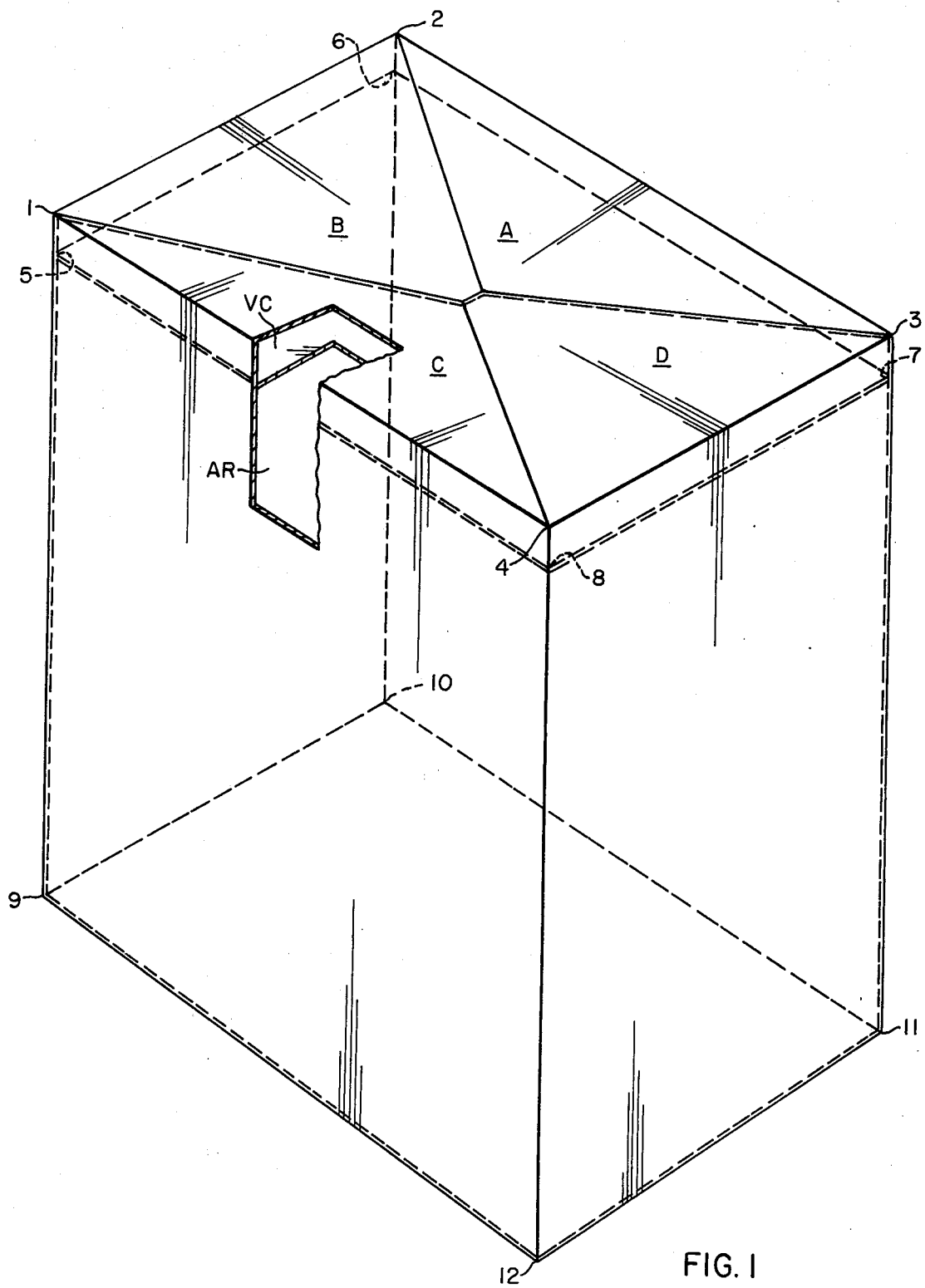
FIG. 1 shows the cabinet according to the present invention.

FIG. 1 represents an electrical cabinet for electrical apparatus, preferably for computer equipment, defined between a top surface having four apices 1, 2, 3, 4 and a bottom surface having four apices 9, 10, 11, 12. This cabinet has seal-proof metallic walls (1, 2, 3, 4) (9, 10, 11, 12) (1, 4, 9, 12), (4, 12, 11, 3), (10, 11, 3, 2) and (9, 10, 2, 1), within which two sealed compartments AR and VC are provided. The AR compartment contains the electrical equipment in the form of electronic components and electrical supply thereof, mounted on racks (not shown) across the vertical walls. Preferably, the AR compartment contains the entire package of a computer system requiring isolation from a hostile environment.

The VC compartment is sealed and constitutes essentially a vaporization chamber defined between planes (5, 8, 7, 6) and (1, 2, 3, 4) at the top of the cabinet. A sufficient quantity of trichlorotrifluoroethane (Freon 113) is enclosed within compartment VC so as to maintain at all times a layer of liquid on the lower surface (5, 6, 7, 8) even when some of the liquid has been vaporized therefrom. This layer is replenished by liquid which is continuously returned in the form of condensate from beneath the top surface (1, 2, 3, 4) i.e., a continuous cyclic flow of working fluid is created.

The temperature of vaporization of Freon 113 is 117° F at 0° p.s.i.g. (47° C at one atmosphere).

The apparatus enclosed in the Ar compartment may for instance be a computer, its power supply and auxiliary circuitry. It is desirable that the equipment contained in the cabinet not be subject to temperatures exceeding 132° F (55° C). This could require an evacuation of excess heat through the heat sink or condenser surface (5, 6, 7, 8) of the vaporization chamber in the order of 1.5 to 2 kilowatts. Considering the usual dimensions of a minicomputer with properly distributed racks of components, this excess of heat represents an evacuation of the order of 3 watts/square inch of the heat sink surface or more, depending on cabinet dimensions. For such requirement, the distance between the two planes defining the heat sink and the heat dissipation of the vaporization chamber VC is selected to be between 10.16 cm and 15.24 cm when Freon 113 is used as the working fluid.

The thermodynamics of operation of a vaporization chamber is well known. The heat received through the heat sink (5, 6, 7, 8) converts an equivalent quantity of liquid into vapor (latent heat of vaporization). This process occurs once the working fluid reaches the aforementioned thermodynamic state of 117° F at 0 p.s.i.g. The vapor reaches the cooler surface of the heat dissipator and gives up its latent heat, then condenses and falls back by gravity to the liquid reservoir. This process is self-sustaining and no exterior means other than the presence of a temperature gradient are necessary to evacuate the heated medium or supply working fluid to the reservoir, as would be the case in a normal heat exchanger using pumps or fans to move the working fluid. Gravity dispenses from the provision of any particular means to force the circulation of the cooling medium.

The choice of Freon 113 allows the vaporization chamber to be operative at normal atmospheric pressure at a given temperature range. Therefore, there is no build-up of pressure inside the sealed compartment VC which otherwise would require reinforced wall structures. Normal cabinet walls can be used and the vaporization chamber may be self-contained and assembled to form the top section of the cabinet structure.

In addition, special provision is made of a thin metallic wall for such cabinet structure. For instance an aluminum sheet can be used. The thinness of the metal is favorable in providing maximum heat conduction efficiency in the heat transfer both for the heat sink or evaporator (5, 6, 7, 8) and the heat dissipator, or condenser (1, 2, 3, 4). This requirement of a thin wall is satisfied, in accordance with the present invention, without any reduction in the overall cabinet strength by providing at the top-surface of the cabinet a certain configuration, as shown by planes A, B, D, C, which are defined by creases formed in the metal and a dimple. This particular structural feature of the top of the cabinet enhances the efficiency of the vaporization chamber by presenting to the vaporized fluid inclined surfaces which tend to accelerate the return of heavy accumulation of liquid and cause the condensate to run from the roof of the chamber down to the pool, or reservoir resting by gravity on the heat sink or evaporator surface.

An additional feature resides in placing within the vaporization chamber at the bottom thereof, a fine mesh of aluminum serving as a screen for the working fluid so that liquid is maintained at all times at the bottom of the chamber over the entire plane of evaporation defined between the sidewalls. As a result, localized burn out is prevented.

The enclosure, according to the present invention, is preferably made of aluminum or steel sheet metal for the side walls as well as for the bottom sections but the top which is the vapor chamber is preferably made of aluminum. The heat dissipator of the vaporization chamber VC is a metal sheet which may be made integral with the four vertical cabinet walls. As earlier explained, the thickness of the metal used is selected to be as small as acceptable for the cabinet strength. In order to strengthen the top section of the cabinet while keeping such minimal acceptable metal thickness. As previously stated, inclined planes are formed to facilitate the return of the condensate by gravity from the heat dissipator down to the heat sink. The top surface may also be made disc-shaped, or incurvated, in any way to create and consists of a surface inclined downward from the periphery. A similar structural shape may also be formed in the opposite direction, e.g., upward to strengthen the heat sink or condenser metal plate.

FIG. 1 shows four planes A, B, C, D defined by creases extending in the top metal sheet from the peripheral apices 1, 2, 3, 4, downward. As a result, the roof of the vaporization chamber VC has a generally polyhedral shape providing preferential directions of flow along which the condensate accumulates and runs down back to the mass of fluid in the liquid state.

The heat sink (5, 6, 7, 8) of the vaporization chamber preferably consists of a transverse plate of metal integrally united with the side walls of the cabinet. The vaporization chamber VC does not carry any appreciable weight, nor does it support any substantial pressure. It does not either occupy much space above the contained equipment. A unitary closed cabinet is thus provided which carries a top section entirely sealed from the outside, and in which a heat transfer feature has been embodied as simply as possible, while only slightly changing the configuration and the overall dimensions of the cabinet without requiring the addition of any substantial part or weight, and that can easily be designed to accommodate any cabinet.

Figure 2:
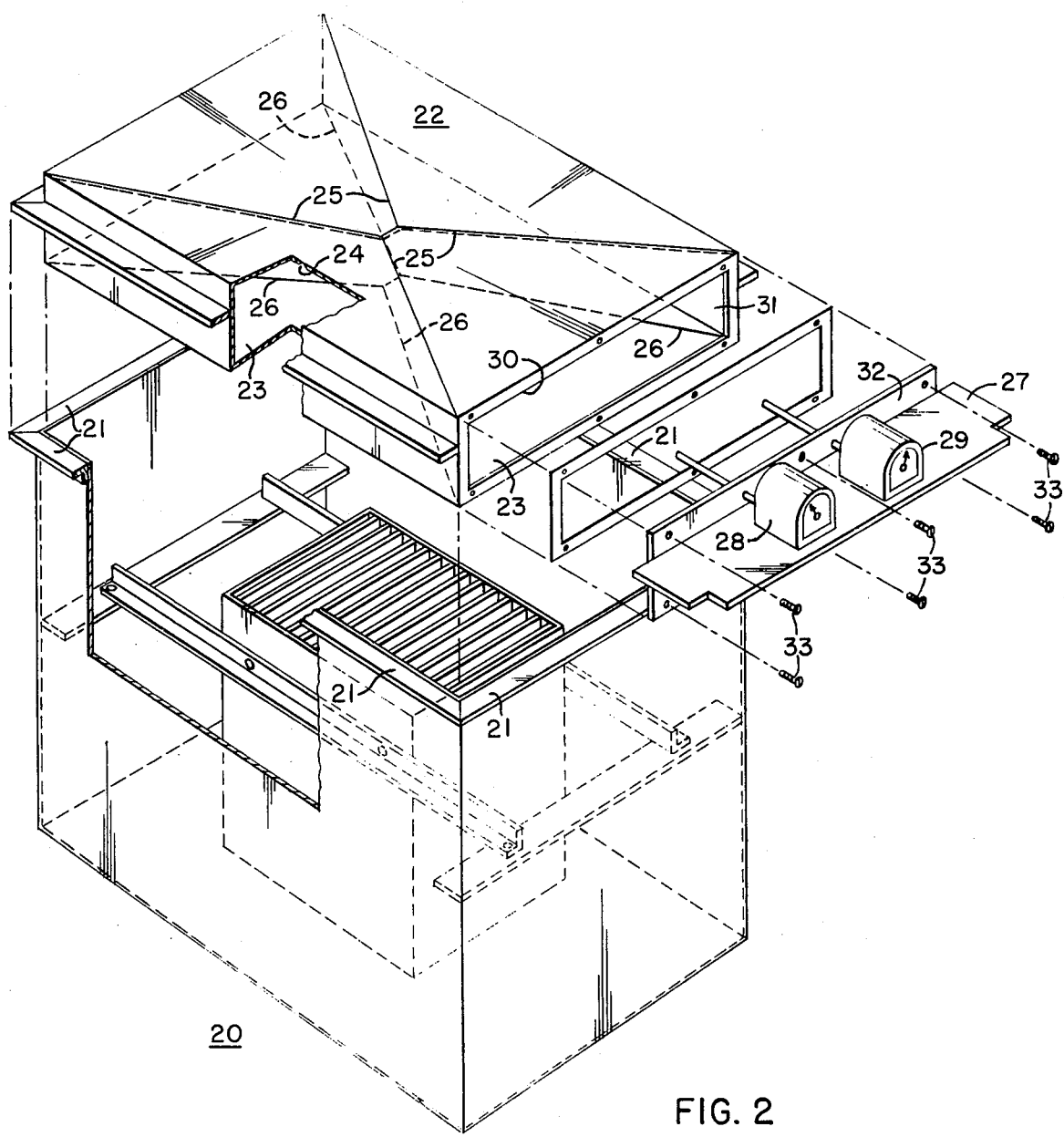
FIG. 2 shows another illustration of the present invention with an amovable vaporization chamber forming the top section of a cabinet containing electrical equipment to be protected from the outside.

The present invention may be carried out in different forms than shown in FIG. 1. FIG. 2 shows a typical top section for a cabinet according to the present invention. FIG. 2 shows how typically the cabinet top according to the present invention is mounted on the upper part of the cabinet. The cabinet 20 is provided with flanges 21 along the upper part of the vertical metal plates on four sides of the enclosure in which electrical components of the enclosed apparatus are mounted. The top section 22 is in the form of a sealed vaporization chamber, containing working fluid which by gravity rests on the lower surface 23. The upper surface 24 of the top section 22 exhibits creases at 25 for the purpose described herebefore. Preferably, but not necessarily, creases at 26 are also provided in the metal sheet forming the lower surface 23. The heat sink, or evaporator, is constituted by the lower metal sheet 23, the heat dissipator, or condenser is found at 24 with the upper metal sheet of the top section 22. A platform 27 is provided which can be mounted easily laterally of the top section on a supporting plate 32. On the platform are mounted pressure and temperature gauges 28, 29 which are in communication with the vaporization chamber through an access port 30, provided with a peripheral point 31 which can be sealed tight between the supporting plate 32 by bolts and screws 33.

It is possible to build the vaporization chamber VC as a separate unit all sealed off in advance, and to build separately the equipment vessel AR with all parts mounted inside as another unit. The two units are then assembled, mounted and joined integrally in order to form the cabinet according to the present invention.

Normally heat from the equipment vessel to the vaporization chamber is transferred to the heat sink by radiation, conduction and convection. Provision can be made, but not necessarily, for an electric fan without the equipment vessel AR, in order to force circulation of the air enclosed in the cabinet toward and along the surface of the heat sink (5, 6, 7, 8) in order to increase heat exchange with the vaporization chamber.

It is also possible to include within the equipment vessel one or more additional vaporization chambers such as VC', VC" and vessels AR', AR" of FIG. 1, each associated with specific electrical components or parts of greater concern. These additional chambers would abandon heat from their heat dissipator surfaces into the air space inside the equipment vessel. In this fashion cascaded cooling may take place from down, at AR', AR" within the equipment vessel AR, up to the main heat sink surface (5, 6, 7, 8) of the main vaporization chamber VC according to the present invention.

I claim:

1. A cabinet for electrical equipment comprising an enclosure having side walls and a bottom surface, a partition defining two compartments one on top of the other, the lower compartment containing electrical equipment and the top compartment being a sealed compartment forming a vaporization chamber defined between said partition as a heat sink and a heat dissipator serving as the top surface of said cabinet;

with said vaporization chamber containing liquid resting by gravity on said partition and having a vaporization temperature above 80° F and below 120° F; and with said top surface being recessed from a horizontal plane defined by the highest points of the side walls of said cabinet.

2. The cabinet of claim 1 with said top surface having a plurality of planar surfaces inclined downward, the form factors of which promote the return of the condensate to the liquid on said partition.

3. The cabinet of claim 2 with said top surface being made of a metal sheet, and said planar surfaces being formed by folding of said metal sheet.

4. A cabinet for electrical equipment comprising a bottom wall, four vertical side walls, an amovable top section adapted to be mounted directly on said side walls to form a closed housing therewith, and means attached at least to said side walls for supporting the electrical equipment inside said closed housing; with said top section consisting of a vaporization chamber and having an upper metallic plate, a lower metallic plate and four side plates, said upper, lower and side plates being integrally united to form a sealed chamber containing liquid trichlorotrifluoroethane resting by gravity on said lower plate; with said lower plate being a heat sink for said cabinet, and with said higher plate being a heat dissipator for said vaporization chamber; and with said upper plate having a plurality of planar surfaces inclined downward, the form factors of which promote the return of the condensate from vapor evolving from said liquid.

5. The cabinet of claim 4 with said lower, upper and side plates having a minimal thickness.

6. A cabinet for electrical equipment comprising an enclosure having side walls and a bottom surface, a partition defining two compartments one on top of the other, the lower compartment containing electrical equipment and the top compartment being a sealed compartment forming a vaporization chamber defined between said partition as a heat sink and a heat dissipator serving as the top surface of said cabinet; said cabinet containing a plurality of individual electrical equipments and the same plurality of enclosures, each enclosure containing one such said individual equipment, with a plurality of secondary vaporization chambers mounted as a top one for each of said enclosures, whereby heat evacuated by said secondary vaporization chambers is collected by said heat sink of said top compartment and evacuated by said heat dissipator of said top compartment.

* * * * *